United States Patent
Gardner et al.

(10) Patent No.: US 10,279,664 B1
(45) Date of Patent: May 7, 2019

(54) VEHICLE SUNSHADE

(71) Applicant: Ford Global Technologies, LLC, Dearborn, MI (US)

(72) Inventors: Cornel Lewis Gardner, Romulus, MI (US); Ali Ammar, Dearborn, MI (US); Scott Holmes Dunham, Redford, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/827,526

(22) Filed: Nov. 30, 2017

(51) Int. Cl.
| *B60J 7/00* | (2006.01) |
| *B60Q 3/208* | (2017.01) |
| *B60R 7/04* | (2006.01) |
| *H03K 17/945* | (2006.01) |
| *H05B 37/02* | (2006.01) |
| *B60Q 3/82* | (2017.01) |

(52) U.S. Cl.
CPC ............ *B60J 7/0007* (2013.01); *B60Q 3/208* (2017.02); *B60Q 3/82* (2017.02); *B60R 7/04* (2013.01); *H03K 17/945* (2013.01); *H05B 37/0227* (2013.01)

(58) Field of Classification Search
CPC ........ B60J 7/0007; B60J 7/0015; B60J 7/003; B60J 7/0038; B60J 7/04; B60J 7/0023; B60R 7/04; B60R 7/00; B60R 7/005; B60R 7/081; B60R 7/082; B60R 7/084; B60R 7/087; B60R 7/088

USPC ................................................ 296/37.7, 214
See application file for complete search history.

(56) References Cited

U.S. PATENT DOCUMENTS

| 4,738,481 | A | 4/1988 | Watjer et al. |
| 5,303,970 | A | 4/1994 | Young et al. |
| 6,367,872 | B1 | 4/2002 | Bohm et al. |
| 7,051,438 | B2* | 5/2006 | O'Brien ................. B60J 5/0416 29/469 |
| 9,136,840 | B2 | 9/2015 | Salter et al. |
| 2004/0160082 | A1* | 8/2004 | Bohm ..................... B60J 7/0015 296/97.11 |
| 2007/0267898 | A1 | 11/2007 | Lin |
| 2012/0307026 | A1* | 12/2012 | Rodriguez .......... H04N 1/00129 348/63 |
| 2014/0226351 | A1 | 8/2014 | Hernandez et al. |
| 2015/0251595 | A1 | 9/2015 | Dellock et al. |

FOREIGN PATENT DOCUMENTS

| EP | 2848470 A1 | 3/2015 |
| JP | 2006-137330 | * 6/2006 |

* cited by examiner

*Primary Examiner* — Dennis H Pedder
(74) *Attorney, Agent, or Firm* — Vichit Chea; Price Henveld LLP

(57) ABSTRACT

A sunshade for a vehicle is provided herein. The sunshade includes a base member having independently movable first and second portions. A first handle is disposed on the first portion and a second handle is disposed on the second portion. A lamp assembly is operably coupled to the base member.

18 Claims, 5 Drawing Sheets

VEHICLE SUNSHADE

FIELD OF THE INVENTION

The present disclosure generally relates to vehicle sunshade assemblies, and more particularly, to vehicle sunshade assemblies employing a lamp assembly therein.

BACKGROUND OF THE INVENTION

Passenger vehicles employ various openings within a roof of a passenger compartment thereof. Sunshades may be used to block the opening from within the passenger compartment. It is desired to create sunshades offering various unique features to meet consumer demands.

SUMMARY OF THE INVENTION

According to one aspect of the present disclosure, a sunshade for a vehicle is provided herein. The sunshade for a vehicle includes a base member having independently movable first and second portions. A first handle is disposed on the first portion and a second handle is disposed on the second portion. A lamp assembly is operably coupled to the base member.

According to another aspect of the present disclosure, a vehicle sunshade is provided herein. The vehicle sunshade includes a handle operably coupled to a base member. A lamp assembly is operably coupled to the handle. The lamp assembly is configured to emit light from the handle when activated.

According to yet another aspect of the present disclosure, a vehicle sunshade is provided herein. The vehicle sunshade includes a handle operably coupled to a base member. A storage assembly is operably coupled to the base member. The storage assembly includes a housing having an upward surface. The upward surface extends above of the base member a first distance that is less than a rear surface of the handle.

These and other aspects, objects, and features of the present invention will be understood and appreciated by those skilled in the art upon studying the following specification, claims, and appended drawings.

DETAILED DESCRIPTION OF THE PREFERRED EXAMPLES

Figure 1:
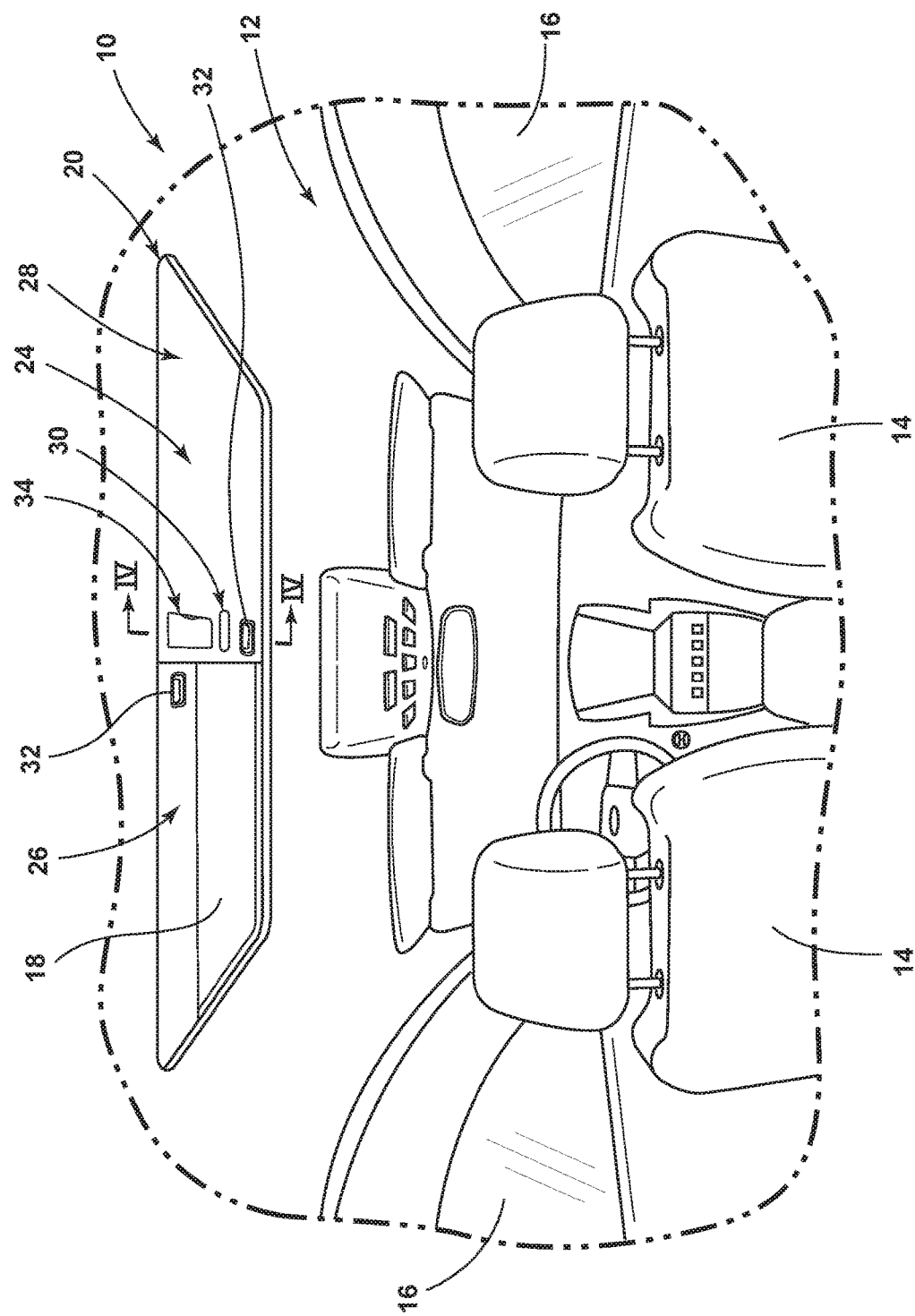
FIG. 1 is a rear perspective view of a passenger compartment of a vehicle employing a sunshade, according to some examples.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary examples of the inventive concepts defined in the appended claims. Hence, specific dimensions and other physical characteristics relating to the examples disclosed herein are not to be considered as limiting, unless the claims expressly state otherwise.

As required, detailed examples of the present invention are disclosed herein. However, it is to be understood that the disclosed examples are merely exemplary of the invention that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present invention.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The following disclosure describes a sunshade for a vehicle. The sunshade may include one or more portions that cover various portions of a window or sunroof. The sunshade may include one or more lamp assemblies therein. The sunshade may further include one or more storage assemblies that may also be operably coupled with the one or more lamp assemblies.

Referring now to FIG. 1, a vehicle 10 is generally shown configured with an enclosed passenger compartment 12. The passenger compartment 12 may be equipped with passenger seats 14 for allowing one or more passengers to be seated within the passenger compartment 12. The vehicle 10 is further shown equipped with a plurality of movable panels including door-mounted movable windows 16 and a roof-mounted movable sunroof 18. The windows 16 may each be actuated by an actuator, such as an electrically powered motor, to move between a downward open position and an upward closed position. Similarly, the sunroof 18 may be driven by an electrically powered motor or another actuator to move between a closed position and an open position. In the open position, the windows 16 and the sunroof 18 expose the passenger compartment 12 to the outside ambient environment, which allows air and thermal energy transfer to occur between the interior of the passenger compartment 12 and the outside environment.

With further reference to FIG. 1, the sunroof 18 generally includes at least one sheet or panel of glass, plastic, or a composite laminate of a thickness and shape configured to be received within or over a window opening 20 formed in a roof structure 22 (FIG. 4) of the vehicle 10. Although the sunroof 18 is shown as a generally rectangular shape located in the forward section of the passenger compartment 12, it is contemplated that the opening may take on any one of a number of shapes and locations including occupying a substantial portion of the roof structure 22. The panel 28 may be made from transparent or tinted glass, which may be tempered, laminated, or otherwise strengthened using conventional techniques. Additionally, the panel 28 may be curved, bent, or generally planar to conform to the desired need or application.

Referring still to FIG. 1, a sunshade 24 is mounted below the sunroof 18 and in a retractable manner and is selectively movable in rearward and forward directions to open and close the sunshade 24. It will be appreciated, however, that the sunroof 18 may move in any other direction without departing from the scope of the present disclosure. The sunshade 24 may be movable about a track assembly that is disposed on a perimeter of the window opening 20. In some examples, the sunshade 24 may include first and second portions 26, 28 that may be independently slidable between various positions. For example, the first portion 26 may be disposed above a first front seat 14 of the vehicle 10, such as a driver's seat, while the second portion 28 may be disposed over an adjacently disposed seat 14, such as a front passenger seat. In instances in which the sunshade 24 includes various portions 26, 28, additional track assemblies may be disposed below the sunroof 18 to guide each portion 26, 28 between any desired position(s). In some examples, the sunshade 24 may be manually moved between various positions. In other examples, the sunshade 24 may be electrically movable between various positions. In yet other examples, the sunshade 24 may be both manually and electrically movable between various positions. It will be appreciated that the sunshade 24 may be used in any position within the vehicle 10 without departing from the scope of the present disclosure.

With further reference to FIG. 1, the sunshade 24 may include various features therein and/or thereon. For example, one or more lamp assemblies 30 may be operably coupled with the sunshade 24 to provide illumination within the passenger compartment 12. The sunshade 24 may also include one or more handles 32 for moving the one or more portions 26, 28 between various positions. Additionally, and/or alternatively, the sunshade 24 may include one or more storage assemblies 34 therein that may be accessible when the sunshade 24 is in a closed position and concealed between a headliner 40 (FIG. 4) and the roof structure 22 (FIG. 4) of the vehicle 10 when the sunshade 24 is in an open position.

Figure 3:
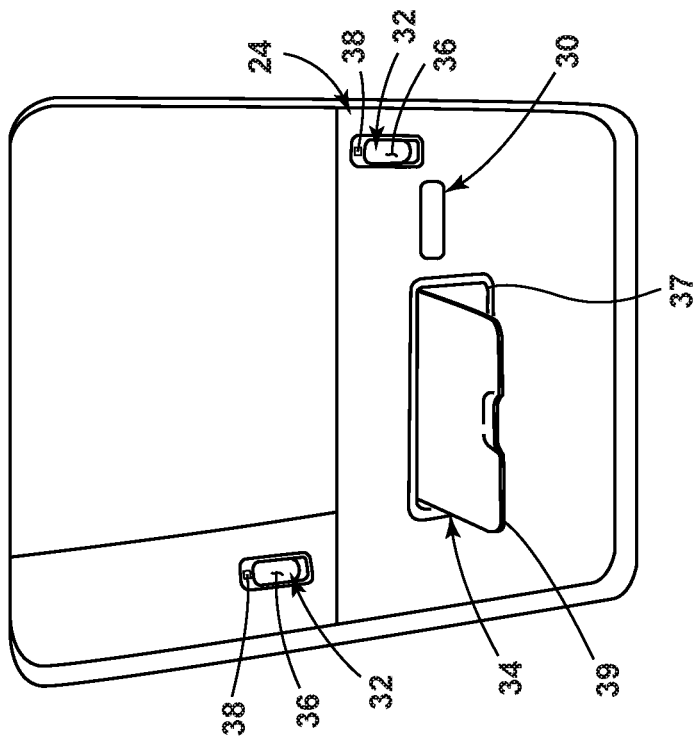
FIG. 3 is a bottom perspective view of the sunshade having the first portion in an open position and the second portion in a closed position, according to some examples.
Figure 2:
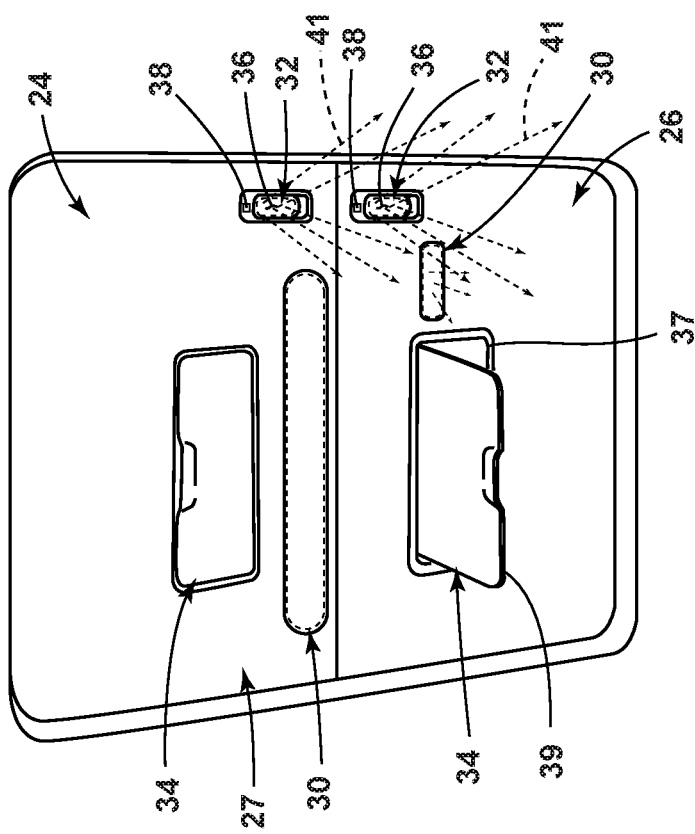
FIG. 2 is a bottom perspective view of the sunshade having two portions each in a closed position and including a lamp assembly and a storage assembly therein, according to some examples.

Referring to FIGS. 2 and 3, the handle 32 includes a peripheral surface and a rear surface 35 (FIG. 4) that define a cavity 36 to pull and/or push the sunshade 24 between various positions. The handle 32 may also define a rim portion 38 that at least partially surrounds the cavity 36. The handle 32 may be formed from any desirable material, including but not limited to, a polymeric material such as acrylonitrile-butadiene-styrene (ABS), polypropylene (PP), or any other material known in the art.

The sunshade 24 may include one or more lamp assemblies 30 therein. In some instances, the one or more lamp assemblies 30 may be operably coupled with the handles 32. Additionally, and/or alternatively, the one or more lamp assemblies 30 may be disposed within a portion 26, 28 of the sunshade 24. In some examples, the one or more lamp assemblies 30 may be capable of supplying light to the passenger compartment 12 while the sunshade 24 is moved between the open and closed positions, such as when the one or more lamp assemblies 30 is operably coupled to the handle 32. Alternatively, the one or more lamp assemblies 30 may be concealed between the headliner 40 and the roof structure 22 of the vehicle 10 when the sunshade 24 is in an open position and capable of illuminating the passenger compartment 12 when the sunshade 24 is in a closed and/or intermediate position.

With further reference to FIGS. 2 and 3, the storage assembly 34 may be operably coupled with the sunshade 24. The storage assembly 34 includes a housing 37 and a lid 39 pivotally mounted to the housing 37. The lid 39 may also include handles and latches for grasping and retaining the doors in closed positions.

Figure 4:
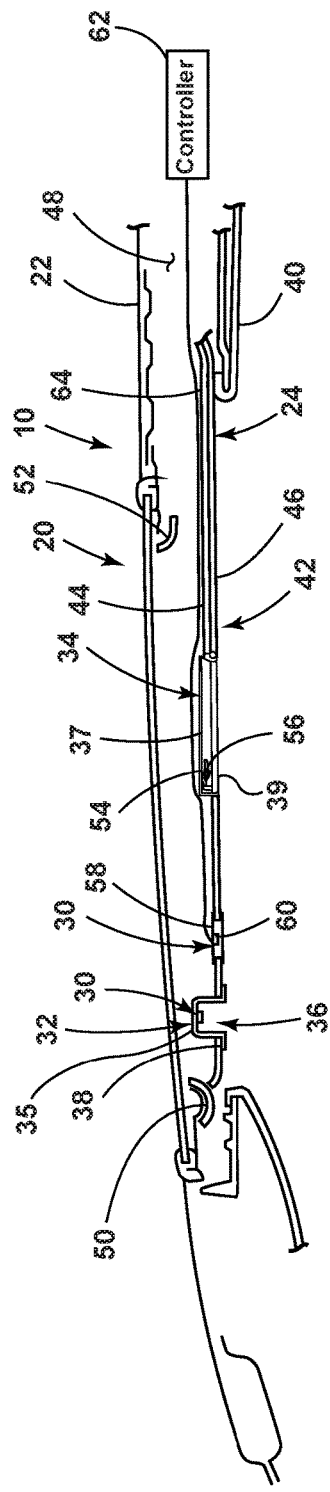
FIG. 4 is a cross-sectional view of the sunshade taken along the line IV-IV of FIG. 1 with the storage assembly in a closed position, according to some examples.
Figure 5:
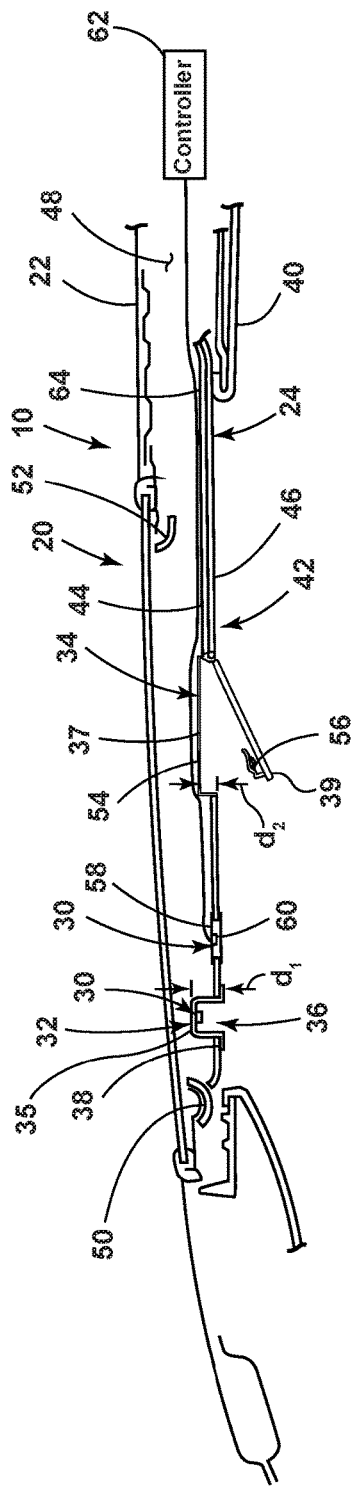
FIG. 5 is a cross-sectional view of the sunshade taken along the line IV-IV of FIG. 1 with the storage assembly in an open position, according to some examples.

Referring to FIGS. 4 and 5, the sunshade 24 is composed of a base member 42. The base member 42 may include a base layer 44 and a skin layer 46. In a closed state, the base member 42 shields sunlight from striking the inside of the vehicle 10 through the sunroof 18. In an open state, the base member 42 is at least partially concealed from the passenger compartment 12 in a space 48 between the headliner 40 and the roof structure 22. In some examples, the base layer 44 may be formed from a rigid and/or flexible material and the skin layer 46 may be of any desired decorative material, such as a fabric. In some examples, a first stop 50 may contact the base member 42 when the sunshade 24 is a fully closed position and a second stop 52 may contact the base member 42 when the sunshade 24 is a fully open position.

The housing 37 may have an upward surface 54 that extends above the base layer 44 to define a storage assembly 34. In some examples, the handle 32 may extend a first distance $d_1$ above the base layer 44 and the upward surface 54 of the housing 37 may extend a second distance $d_2$ above the base layer 44. In some instances, the second distance $d_2$ may be less than the first distance $d_1$. A retaining feature 56 may be operably coupled to the housing 37 and/or the lid 39. The retaining feature 56 may be configured as a clip, a shelf, and/or any other type of retaining feature 56 without departing from the scope of the present disclosure.

With further reference to FIGS. 4 and 5, the one or more lamp assemblies 30 may be operably coupled with the sunshade 24. In some examples, the one or more lamp assemblies 30 may be disposed along the sunshade 24. Moreover, in some instances, each portion 26, 28 of the sunshade 24 may include one or more lamp assemblies 30 thereon that may be independently illuminated. Additionally, and/or alternatively, the one or more lamp assemblies 30 may be disposed within the handle 32 on one or more portions 26, 28 of the sunshade 24. As illustrated in FIGS. 4 and 5, the one or more lamp assemblies 30 may include a casing 58 and a light source 60 may be disposed within the casing 58. With respect to the examples described herein, the light source 60 may be configured to emit visible and/or non-visible light, such as blue light, UV light, infrared, and/or violet light and may include any form of light source. For example, fluorescent lighting, light-emitting diodes (LEDs), organic LEDs (OLEDs), polymer LEDs (PLEDs), laser diodes, quantum dot LEDs (QD-LEDs), solid-state lighting, a hybrid of these or any other similar device, or any other form of lighting. Further, various types of LEDs are suitable for use as the light source 60 including, but not limited to, top-emitting LEDs, side-emitting LEDs, and others. Moreover, according to various examples, multicolored light source, such as Red, Green, and Blue (RGB) LEDs that employ red, green, and blue LED packaging may be used to generate various desired colors of light output from a single light source, according to known light color mixing techniques.

In some examples, the light source 60 may be configured as electroluminescent lighting, such as electroluminescent panels including electroluminescent polymers. Electroluminescence occurs when a material emits light 41 in response to passage therethrough of an electrical current or a strong electrical field, causing excited electrons to release energy as photons or light 41. At a high level, an electroluminescent polymer or film can be provided by sandwiching a phosphor layer between a pair of electrodes. An electrical current established between the electrodes will excite electrons in the phosphor layer, causing emission of light 41.

The light source 60 may be operably coupled to a controller 62 that may activate the light source 60 based on a plurality of inputs and may modify the intensity of the light 41 emitted by the light source 60 by pulse-width modulation, current control, and/or any other method known in the art. In various examples, the controller 62 may be configured to adjust a color and/or intensity of light 41 emitted from the light source 60 by sending control signals to adjust an intensity or energy output level of the light source 60. According to some examples, the controller 62 may increase the intensity of light 41 emitted from the light source 60 up to five times steady state. The one or more lamp assemblies 30 are electrically coupled to the controller 62 through one or more electrical leads 64. In some examples, the one or more electrical leads 64 may be configured as a ribbon wire and may be operably coupled with each light source 60 and the controller 62 to provide power thereto. The one or more electrical leads 64 may be attached to the sunshade 24 through any fastener and/or adhesive known in the art.

Figure 6:
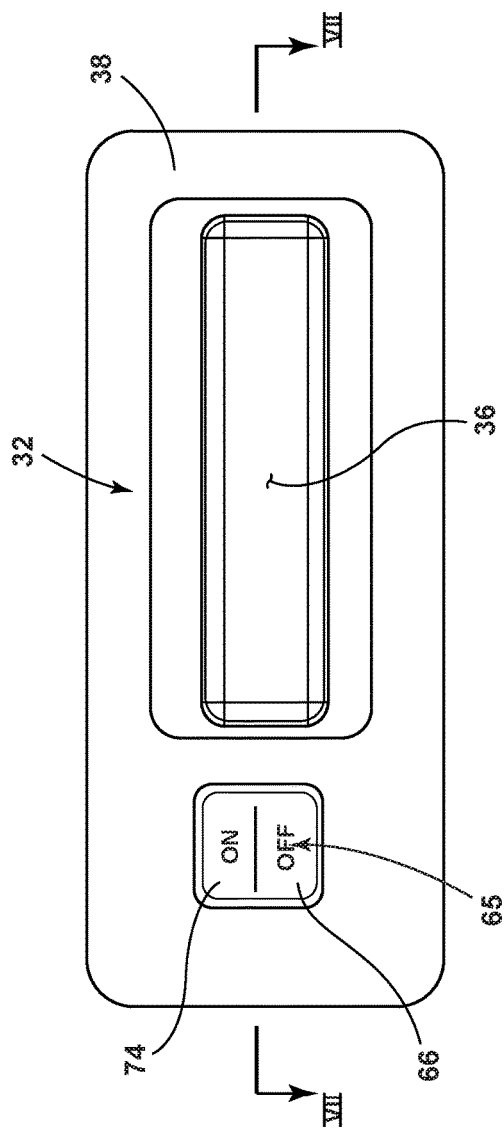
FIG. 6 is a bottom plan view of the first handle or the second handle having a switch assembly disposed thereon, according to some examples.
Figure 7:
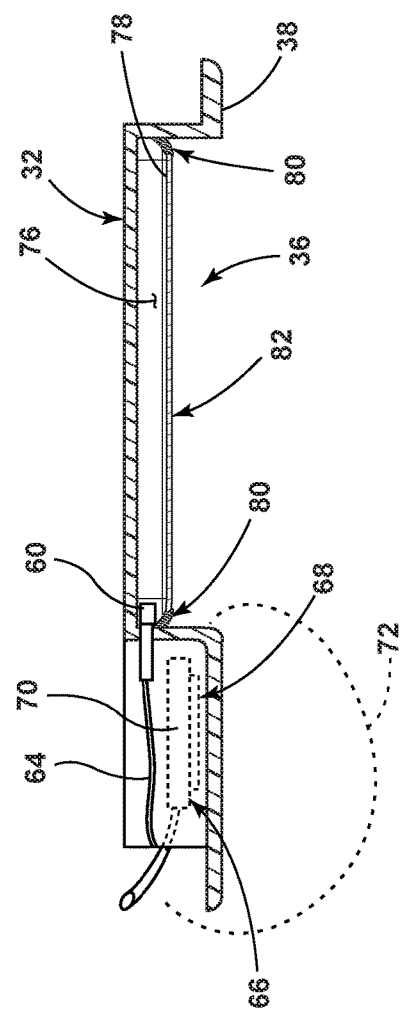
FIG. 7 is a cross-sectional view taken along the line VII-VII of FIG. 6.

Referring to FIGS. 6 and 7, a switch assembly 66 may be disposed on the rim portion 38, within the handle 32, on the sunshade 24, and/or in any other location of the passenger compartment 12 for controlling light output from the one or more lamp assemblies 30. The switch assembly 66 may activate/deactivate the one or more lamp assemblies 30, move the sunroof 18 between open and closed positions, and/or activate/deactivate any other feature of the vehicle 10. In various examples, the switch assembly 66 includes one or more proximity sensors 68 for activating/deactivating any feature within the vehicle 10. The proximity sensors 68 are mounted on a substrate 70 for generating a sense activation field 72 to sense contact or close proximity (e.g., within one millimeter) of an object, such as the hand (e.g., palm or finger(s)) of an operator. The proximity sensor 68 may also detect a swiping motion by the hand of the operator such as a swipe of the thumb or other finger. It will be appreciated by those skilled in the art that additional or alternative types of proximity switches can be used, such as, but not limited to, capacitive sensors, inductive sensors, optical sensors, temperature sensors, resistive sensors, the like, or a combination thereof. It will be appreciated that the switch assembly 66 may additionally and/or alternatively include a mechanical switch of any type known in the art, such as a push button. In push button examples, a membrane may be provided as a seal over the switch. Depression of the membrane causes depression of a plunger on the switch. Internal switch contacts then change positions to provide an output signal.

With further reference to FIGS. 6 and 7, the switch assembly 66 may include indicia 74 thereon and may be operably coupled with a light source 60 to provide illumination thereto. The indicia 74 may provide any desired information, including, but not limited to, the function of the switch assembly 66, the current state of the device that the switch controls, and/or the setting of the device that the switch controls. The illumination of the switch assembly 66 may be desirable to enhance the visibility of the switch assembly 66 and/or indicia 74, to provide information about usage or function of the switch assembly 66, and/or to provide an aesthetically pleasing light 41. The indicia 74 may be defined by one or more luminescent structures 65. The one or more luminescent structures 65 may luminesce in response to receiving light 41 of a specific wavelength to illuminate the indicia 74.

With further reference to FIG. 7, the light source 60 may be operably coupled with a light guide 76. The light guide 76 described herein may be formed from a rigid material that is comprised of a curable substrate such as a polymerizable compound, a mold in clear (MIC) material or mixtures thereof. Acrylates are also commonly used for forming rigid light pipes, as well as polymethyl methacrylate (PMMA), which is a known substitute for glass. A polycarbonate material may also be used in an injection molding process to form the rigid light guides. Further, the light guide 76 may be a flexible light guide, wherein a suitable flexible material is used to create the light guide 76. Such flexible materials include urethanes, silicone, thermoplastic polyurethane (TPU), or other like optical-grade flexible materials. Whether the light guide 76 is flexible or rigid, the light guide 76, when formed, is substantially optically transparent and/or translucent and capable of transmitting light 41. The light guide 76 may be referred to as a light pipe, a light plate, a light bar or any other light carrying or transmitting substrate made from a clear or substantially translucent material.

A lens cover 78 and a gasket 80 are also provided in the one or more lamp assemblies 30 for isolating various components of the one or more lamp assemblies 30 from external contaminants and weather. The lens cover 78 may include optics 82 thereon. For example, the lens cover 78 may be configured with a Fresnel lens, a pillow optic, and/or any other type of lens or optic that is configured to disperse, concentrate, and/or otherwise direct light 41 emitted from the one or more lamp assemblies 30 therethrough in any desired manner. The optics 82 may assist in directing light 41 in a desired direction.

Figure 8:
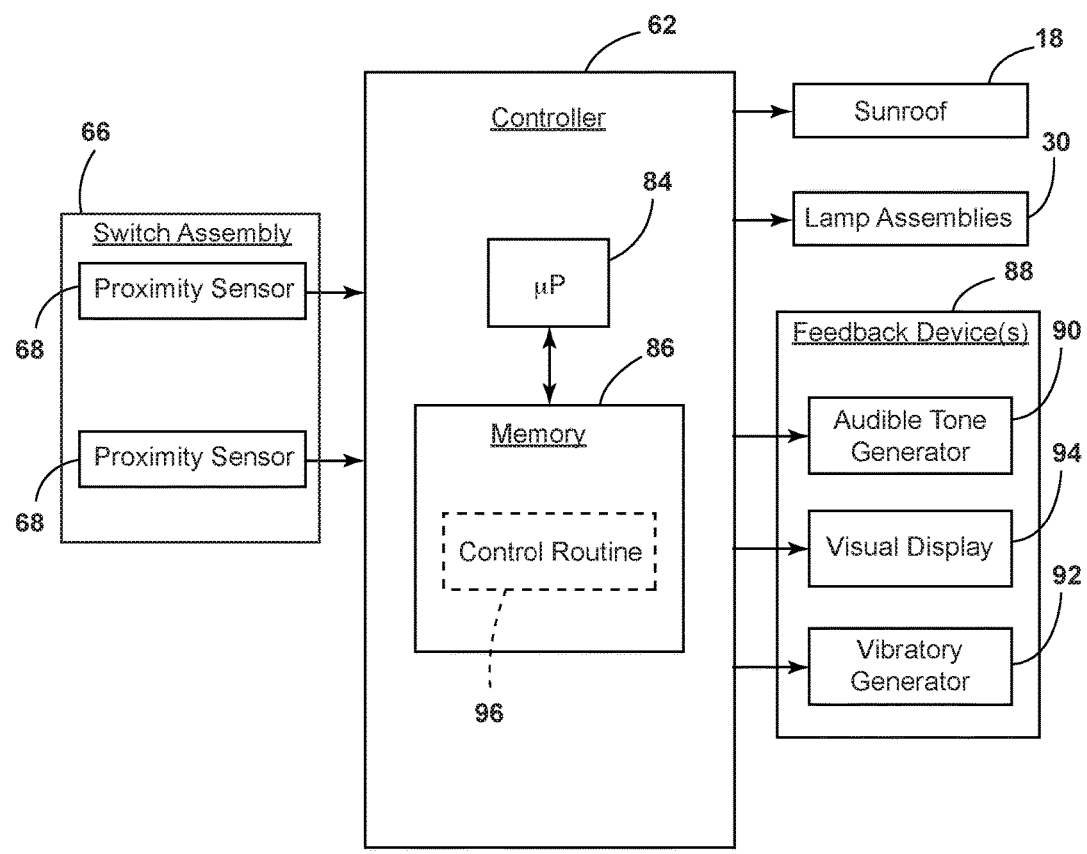
FIG. 8 is a block diagram of the switch assembly operably coupled with a controller and one or more output devices.

Referring to FIG. 8, the switch assembly 66 is illustrated according to some examples. A plurality of proximity sensors 68 are shown providing inputs to the controller 62. The controller 62 may include control circuitry, such as a microprocessor 84 and memory 86. The control circuitry may include sense control circuitry processing the activation field 72 to sense user activation of the switch by comparing the activation field 72 to a threshold. It will be appreciated that other analog and/or digital control circuitry may be employed to process the activation field 72, determine user activation, and initiate an action. The controller 62 provides an output signal to one or more devices that are configured to perform dedicated actions responsive to correct activation of a proximity sensor. For example, the one or more devices may include the sunroof 18 16 having a motor to move the sunroof 18 between open, closed, and tilt positions, and/or the one or more lamp assemblies 30 that may be activated and deactivated. Other devices may be controlled such as a radio for performing on and off functions, volume control, scanning, and other types of devices for performing other dedicated functions. One of the proximity sensors 68 may be dedicated to actuating the sunroof 18 closed, another proximity sensor 68 may be dedicated to actuating the sunroof 18 open, and a further switch may be dedicated to actuating the sunroof 18 to a tilt position, all of which would cause a motor to move the sunroof 18 to a desired position.

The controller 62 may also provide an output signal to one or more user-perceived feedback devices 88 to generate a perceived feedback to a user. According to some examples, the user-perceived feedback devices 88 may include an audible tone generator 90, such as a speaker, for generating an audible signal. According to other examples, the one or more user feedback devices 88 may include a tactile vibratory generator 92 for generating a vibration of the proximity sensor or some other device or surface, such as a steering wheel or an armrest or seat 14 upon which the user is seated. Further, the feedback device 88 may employ a visual display 94 to display feedback information in the form of text or icons. The user-perceived feedback devices 88 provide an audible tone, vibration, light and/or visual display to the user in response to activation of the one or more proximity sensors 68.

When a user attempts to activate a switch with a wrong touch condition, a first or wrong touch feedback is generated to indicate to the user that the switch was wrongly activated. A wrong touch activation may include activation of one or more concealed lamp assemblies 30 (e.g., the one or more lamp assemblies 30 is disposed between the headliner 40 and the roof structure 22 while the sunshade 24 is in an open position), according to some examples. The user-perceived feedback device 88 may generate a second or action completed feedback to the user when the action actuated has been completed. A third or right touch feedback may be generated when an allowed activation of a proximity sensor is detected.

The controller 62 processes one or more routines including routine 96 to generate user-perceived feedback based on activation of one or more of the proximity sensors 68. The controller 62 monitors the proximity sensors 68 for an activation of one or more of the proximity sensors 68 and performs the dedicated action when a right touch activation is detected. When an activation is properly detected, a right touch feedback may be provided by any of the feedback devices 88. The controller 62 also monitors proximity sensors 68 for the presence of a wrong touch activation of the proximity sensor assembly and generates a wrong touch feedback in response thereto. The wrong touch condition may be due to an ambiguous input such as a simultaneous activation of two or more switches or may be the activation of a switch for which an action cannot be performed. The feedback generated for a wrong touch is different from the feedback generated for a right touch so that the user may decipher between wrong touch and right touch activations of the switch assembly 66. The controller 62 further determines when the action actuated by the activation of a proximity sensor is complete and provides in response thereto an action complete feedback from one or more of the feedback devices 88. The action complete feedback is different from the wrong touch feedback and the right touch feedback such that a user may decipher the differences therebetween.

A variety of advantages may be derived from the use of the present disclosure. For example, use of the disclosed sunshade provides a unique aesthetic appearance to the vehicle. Moreover, the sunshade may add additional storage assemblies to a passenger compartment. The sunshade may employ one or more lamp assemblies for illuminating the passenger compartment in a location that is currently unilluminated in most instances. The sunshade may be manufactured at low costs when compared to standard vehicle sunshade assemblies.

According to various examples, a sunshade for a vehicle is provided herein. The sunshade for a vehicle includes a base member having independently movable first and second portions. A first handle is disposed on the first portion and a second handle is disposed on the second portion. A lamp assembly is operably coupled to the base member. Examples of the sunshade for a vehicle can include any one or a combination of the following features:

- the lamp assembly is disposed along the base member;
- the lamp assembly is configured to emit light from a cavity defined by the first handle;
- the first handle defines a cavity and a rim portion and a switch assembly is disposed on the rim portion;
- the switch assembly is configured as a proximity sensor that detects an object disposed within a sense activation field;
- the lamp assembly disposed along the base member is at least partially concealed between a headliner and a roof structure when the base member is disposed in an open position;
- a storage assembly operably coupled to the base member;
- the storage assembly includes a housing having an upward surface, the upward surface extending above of the base member a first distance that is less than a rear surface of the first handle;
- a lid movably coupled to the housing;
- a luminescent structure disposed on the switch assembly and configured to luminesce in response to receiving light from the lamp assembly;
- a retaining feature disposed between the lid and the housing; and/or
- a light guide optically coupled to the lamp assembly and disposed within the first handle.

Moreover, a method of manufacturing a sunshade for a vehicle is provided herein. The method includes forming a base member having independently movable first and second portions. A first handle is coupled to the first portion and a second handle is coupled to the second portion. A lamp assembly is operably coupled to the base member.

According to some examples, a vehicle sunshade is provided herein. The vehicle sunshade includes a handle operably coupled to a base member. A lamp assembly is operably coupled to the handle. The lamp assembly is configured to emit light from the handle when activated. Examples of the vehicle sunshade can include any one or a combination of the following features:

- a light guide optically coupled to the lamp assembly and disposed within the handle;
- a lens cover, wherein the light guide is disposed between a rear surface of the handle and the lens cover; and/or
- a storage assembly operably coupled to the base member.

According to other examples, a vehicle sunshade is provided herein. The vehicle sunshade includes a handle operably coupled to a base member. A storage assembly is operably coupled to the base member. The storage assembly includes a housing having an upward surface. The upward surface extends above the base member a first distance that is less than a rear surface of the handle. Examples of a vehicle sunshade can include any one or a combination of the following features:

the base member includes independently movable first and second portions;
a lamp assembly operably coupled to the base member; and/or
the storage assembly includes a retaining feature disposed between a lid rotatably coupled to the housing.

It will be understood by one having ordinary skill in the art that construction of the described invention and other components is not limited to any specific material. Other exemplary examples of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

Furthermore, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality, and any two components capable of being so associated can also be viewed as being "operably couplable" to each other to achieve the desired functionality. Some examples of operably couplable include, but are not limited to, physically mateable and/or physically interacting components and/or wirelessly interactable and/or wirelessly interacting components and/or logically interacting and/or logically interactable components. Furthermore, it will be understood that a component preceding the term "of the" may be disposed at any practicable location (e.g., on, within, and/or externally disposed from the vehicle) such that the component may function in any manner described herein.

It is also important to note that the construction and arrangement of the elements of the invention as shown in the exemplary examples is illustrative only. Although only a few examples of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connectors or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary examples without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A vehicle comprising:
a sunshade having independently movable first and second portions slidable within a track assembly;
a first handle disposed on the first portion and a second handle disposed on the second portion;
a storage assembly operably coupled to the sunshade, wherein the storage assembly includes a housing having an upward surface extending above the sunshade; and
a lamp assembly operably coupled to the sunshade.

2. The vehicle of claim 1, wherein the lamp assembly is disposed along the sunshade.

3. The vehicle of claim 1, wherein the lamp assembly is configured to emit light from a cavity defined by the first handle.

4. The vehicle of claim 1, wherein the first handle defines a cavity and a rim portion and a switch assembly is disposed on the rim portion.

5. The vehicle of claim 4, wherein the switch assembly is configured as a proximity sensor that detects an object disposed within a sense activation field.

6. The vehicle of claim 2, wherein the lamp assembly disposed along the sunshade is at least partially concealed between a headliner and a roof structure when the sunshade is disposed in an open position.

7. The vehicle of claim 1, wherein the first handle has a rear surface extending above the sunshade by a first distance and the upward surface extends above the sunshade by a second distance, wherein the second distance is less than the first distance.

8. The vehicle of claim 7, further comprising:
a lid movably coupled to the housing.

9. The vehicle of claim 4, further comprising:
a luminescent structure disposed on the switch assembly and configured to luminesce in response to receiving light from the lamp assembly.

10. The vehicle of claim 8, further comprising:
a retaining feature disposed between the lid and the housing.

11. The vehicle of claim 7, further comprising:
a light guide optically coupled to the lamp assembly and disposed within the first handle.

12. A vehicle comprising:
a sunshade slidable within a track assembly;
a handle operably coupled to sunshade;
a storage assembly operably coupled to the sunshade, wherein the storage assembly includes a housing having an upward surface extending above the sunshade; and
a lamp assembly operably coupled to the handle, wherein the lamp assembly is configured to emit light from the handle when activated.

13. The vehicle of claim 12, further comprising:
a light guide optically coupled to the lamp assembly and disposed within the handle.

14. The vehicle of claim 13, further comprising:
a lens cover, wherein the light guide is disposed between a rear surface of the handle and the lens cover.

15. A vehicle comprising:
a sunshade slidable within a track assembly;
a handle operably coupled to the sunshade and having a rear surface extending above the sunshade by a first distance; and
a storage assembly operably coupled to the sunshade, wherein the storage assembly includes a housing having an upward surface, the upward surface extending above the sunshade by a second distance that is less than the first distance of the rear surface of the handle.

16. The vehicle of claim 15, wherein the sunshade includes independently movable first and second portions.

17. The vehicle of claim 15, further comprising:
a lamp assembly operably coupled to the sunshade.

18. The vehicle of claim 15, wherein the storage assembly includes a retaining feature operatively coupled to at least one of the housing and a lid rotatably coupled to the housing.

\* \* \* \* \*